United States Patent [19]
Chen

[11] Patent Number: 5,834,341
[45] Date of Patent: Nov. 10, 1998

[54] PROCESS FOR FABRICATING LOW OFF CURRENT THIN FILM TRANSISTOR

[75] Inventor: Heng-Tien Henry Chen, Taipei, Taiwan

[73] Assignee: Winbond Electronics Corporation, Hsinchu, Taiwan

[21] Appl. No.: 551,813

[22] Filed: Nov. 7, 1995

[51] Int. Cl.$^6$ ............................ H01L 21/00; H01L 21/84
[52] U.S. Cl. ........................................... 438/152; 438/158
[58] Field of Search .................................. 438/152, 212, 438/158; 257/67, 903

[56] References Cited

U.S. PATENT DOCUMENTS

| | | | |
|---|---|---|---|
| 5,510,278 | 4/1996 | Nguyen | 438/158 |
| 5,547,892 | 8/1996 | Wuu | 438/152 |
| 5,599,729 | 2/1997 | Park | 438/152 |

OTHER PUBLICATIONS

S. Wiolf, Silicon Processing for the VLSI Era, vol. 2, Lattice Press (1990).

Primary Examiner—John Niebling
Assistant Examiner—Michael S. Lebentritt
Attorney, Agent, or Firm—Meltzer, Lippe, Goldstein, et al.

[57] ABSTRACT

The invention is directed to a thin film transistor (TFT) wherein HF precleaning of a gate oxide layer is eliminated, thus avoiding surface degradation and maintaining the smoothness of the gate oxide layer. This results in a TFT that has low Ioff, low stand-by power, and high Ion/Ioff ratio. The invention forms a TFT by depositing a smooth surfaced TFT oxide layer over the TFT gate poly layer. The TFT gate poly layer includes a gate and a drain connection to the drain of a driver. No via hole is patterned over the TFT gate oxide before the TFT body film deposition. Therefore, no HF precleaning step is used. The TFT body layer is then deposited over the gate layer. Source and drain regions are formed in the TFT body layer. In order to connect to drain region of the TFT body layer with the drain connection in the TFT gate layer, a via is formed through the TFT drain and TFT oxide layer. Polysilicon is formed on the walls of the via to provide a conductive path from the TFT drain to the TFT drain connection of the TFT gate layer.

15 Claims, 8 Drawing Sheets

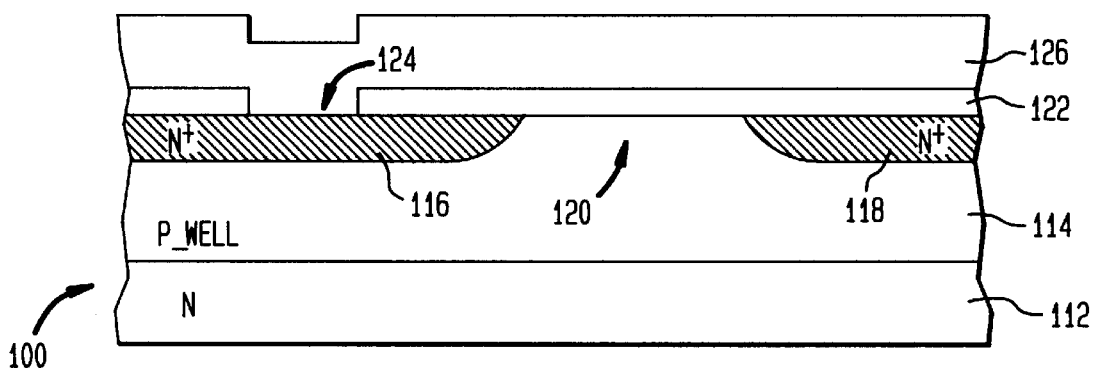
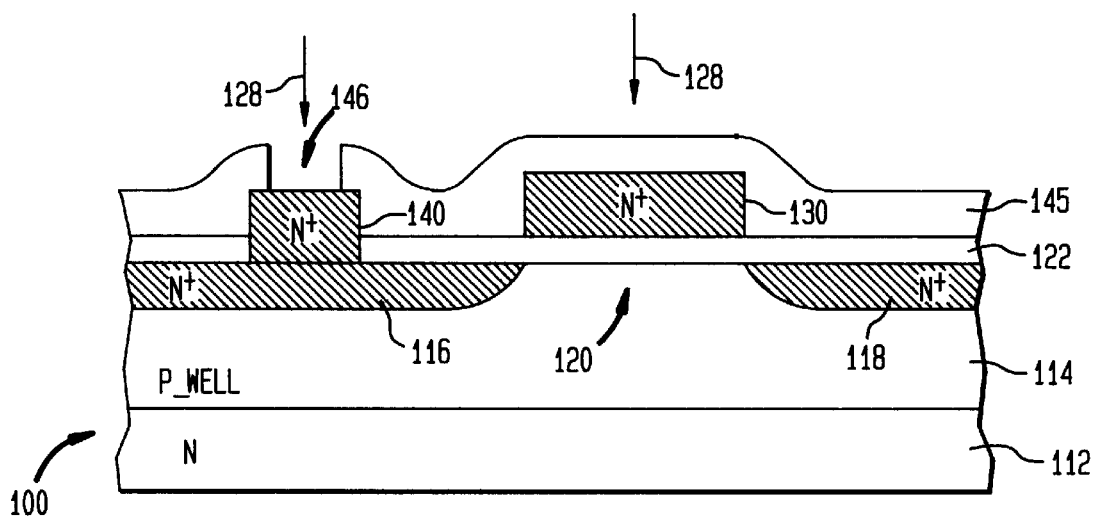

PROCESS FOR FABRICATING LOW OFF CURRENT THIN FILM TRANSISTOR

FIELD OF THE INVENTION

The present invention relates to a structure and process for fabricating a thin film transistor (TFT) which has a low off current and is used in SRAM (Static Random Access Memory) cell applications.

BACKGROUND OF THE INVENTION

FIG. 1 schematically illustrates an SRAM cell 10. The SRAM cell 10 comprises first and second drivers N1 and N2. Illustratively, the drivers N1 and N2 are pulldown NMOS devices N1 and N2. The source of N1 12 and the source of N2 14 are connected to a reference voltage VSS which, for example, is ground. The drain 16 of N2 is connected to the gate 18 of N1. The drain 20 of N1 is connected to the gate 22 of N2. The SRAM cell 10 of FIG. 1 also comprises two load devices L1 and L2. The load devices L1 and L2 each have one terminal 24, 26 connected to a reference voltage VDD and another terminal 28, 30 connected to the drains 20, 16 of N1 and N2, respectively. The reference VDD is positive with respect to VSS.

The SRAM cell 10 also comprises two additional NMOS devices N3 and N4. The devices N3 and N4 are pass transistors. The gates 32, 34 of N3 and N4 are connected to a wordline whose signal value is designated WORD. The sources 36, 38 of N3 and N4 are connected to bit lines whose signal values are designated BIT and $\overline{\text{BIT}}$, respectively. The drains 40, 42 of N3 and N4 are connected the drains 20, 16 of N1 and N2, respectively.

To write the cell, DATA (logic "1" or logic "0") is placed on the BIT line and $\overline{\text{DATA}}$ is placed on the $\overline{\text{BIT}}$ line. Then WORD is asserted. A read operation commences by precharging the BIT and $\overline{\text{BIT}}$ lines. The WORD line is asserted and either the BIT or $\overline{\text{BIT}}$ line will be discharged by one of the pull down transistors N1 or N2. The purpose of the load devices L1 and L2 is to counteract the effect of charge leakage at the drains 20, 16 of N1 and N2.

The load devices L1 and L2 may be polycrystalline silicon resistors or PMOS devices. In the case where L1 and L2 are PMOS devices, the sources of the PMOS devices are connected to VDD; the drains of the PMOS devices are connected to the drains 20, 16 of N1 and N2; and the gates of the PMOS devices are connected to the gates of the NMOS pull down devices N1 and N2.

To reduce the size of the SRAM cell 10 and for use in advanced applications, where higher density and lower standby power is required, the load devices L1 and L2 may be implemented as thin film transistor (TFT) PMOS devices. In this case, the SRAM cell is known as a TFT SRAM cell.

A TFT SRAM cell 50 is shown in FIG. 2. The load devices are now designated P1 and P2 and are implemented by PMOS thin film transistors (TFTs). The sources 52, 54 of P1 and P2 are connected to VDD and the drains 56, 58 of P1 and P2 are connected to the drains 20, 16 of N1 and N2 (and the drains 40, 42 of N3 and N4). The gates 60, 62 of P1 and P2 are connected to the gates 18, 22 of N1 and N2, respectively.

The current in the leg 70, comprising P1 and N1, is designated Ion when P1 is on, and Ioff when P1 is off. (Similar currents Ion and Ioff may be defined for the leg 80 comprising P2 and N2). It is desirable to have Ioff be as small as possible so that the ratio Ion/Ioff is large. In applications requiring large power-saving, i.e., low standby power, a TFT is desired having extremely low off current (Ioff), e.g., Ioff<1 pA. Fabricating a TFT having low Ioff is difficult.

FIGS. 3a–3d show forming a TFT SRAM structure 100, which is in one of the legs, e.g., leg 70, of the TFT SRAM cell 50 of FIG. 2. As shown in FIG. 3a, the TFT SRAM structure 100 has an N-type silicon substrate 112 with a P-well 114 formed thereon. N$^+$ drain 116 and source 118 are formed in the P-well 114 separated by a channel 120. An oxide layer 122 is formed over the TFT SRAM structure 100. A portion of the oxide layer 122 is etched to expose an opening 124 over a portion of the drain 116. A first layer of polysilicon (poly-1) 126 is deposited over the oxide layer 122 and over the opening 124.

As shown in FIG. 3b, the poly-1 layer 126 is patterned and doped by implanting N-type ions 128, to form an N$^+$ gate 130 over the channel 120 and an N$^+$ drain connection 140 over the exposed portion of the drain 116 (i.e., over the opening 124). The drain, source and gate 116, 118, 130 correspond to the drain, source and gate 20, 12, 18 of the N1 pulldown transistor shown in FIGS. 1 and 2. Next, an inter-poly-dielectric (IPD) layer 145 is formed over the gate 130, the oxide layer 122 and the sides of the N$^+$ drain connection 140. The IPD layer 145 is patterned to form an opening 146 which exposes a portion of the N$^+$ drain connection 140.

The TFT P1 shown in FIG. 2 is then formed over the IPD layer 145 as follows. A poly-2 layer 147, shown in FIG. 3c, is formed over the IPD layer 145 and the exposed portion of the N$^+$ drain connection 140, through the opening 146. The poly-2 layer 147 is heavily doped with N-type ions 149. As shown in FIG. 3d, the N-type poly-2 layer 147 is then patterned to form an N$^+$ poly-2 connection 155 and an N$^+$ TFT gate 160. The N$^+$ poly-2 connection 155 is in electrical contact with the N$^+$ drain connection 140.

A TFT oxide layer 165 is formed over the N$^+$ poly-2 connection 155, the TFT gate 160 and the remaining IPD layer 145. The TFT oxide layer 165 is patterned and etched to expose a portion of the N$^+$ poly-2 connection 155. Next, the patterned TFT oxide layer 165 is cleaned with hydrofluoric acid (HF). This HF precleaning is necessary to clean any residue resulting from patterning of the TFT oxide layer 165 and to clean native oxides over the exposed N$^+$ poly-2 connection 155. Immediately after this precleaning, a poly-3 layer 170, referred to as a TFT body layer, is formed over the precleaned and patterned TFT oxide layer 165. The poly-3 layer 170 is doped with N-type ions.

After depositing the N-type TFT body layer 170, additional P-type ions 175 are selectively implanted therein to form P$^+$ drain 180 and source 185 of the TFT. The TFT P$^+$ drain 180 and source 185 are separated by a TFT channel 190. The P$^+$ drain 180 is partially located over the N$^+$ connection 155, and the P$^+$ source 185 is partially located over the N$^+$ TFT gate 160. Referring to FIG. 2, the N$^+$ poly-2 connection 155 is used for connecting the drain 20 of the pulldown NMOS N1 to the drain 56 of the TFT P1.

To obtain a TFT having a low Ioff, it is important to assure a good quality TFT body (poly-3) film 170. Forming a good quality TFT body layer 170 requires deposition of the TFT body film 170 over the gate oxide layer 165 at low temperatures followed by low temperature annealing performed for an extended period of time.

Such a slow process still does not assure deposition of a good quality TFT body film 170 since smoothness of the film 170 is not well controlled, resulting in a film 170 having a rough surface. Achieving a good quality smooth TFT body layer 170 requires a smooth underlying surface onto which the TFT body layer 170 is to be deposited. That is, the surface of the TFT gate oxide 165, which is the layer under the TFT body layer 170, should have a smooth surface. A rough surfaced TFT gate oxide layer 165 contributes a significant amount of defects and dislocations to the TFT body layer 170 deposited thereon, no matter how much effort is expended in the TFT body layer deposition and annealing.

HF precleaning is required to clean the exposed portion of the $N^+$ poly-2 connection 155 before the deposition of the TFT body layer 170. This HF precleaning step also etches the patterned TFT oxide layer 165 and produces significant roughness over the surface of the TFT oxide layer 165 onto which the TFT body layer 170 is to be deposited. This prevents the deposition of a smooth surfaced TFT body layer 170. Not having a smooth surfaced TFT body layer 170 tends to inhibit the formation of a low off current TFT.

Accordingly, it is an object of the invention to provide a method for making a TFT, such as a TFT-SRAM cell, which has a low off current.

Another object of the invention is to provide a method for making a TFT cell in which the HF precleaning step is eliminated and a via which provides a good connection between the TFT body and gate layers is formed.

SUMMARY OF THE INVENTION

The present invention provides a process which eliminates HF precleaning in fabrication of TFTs thus avoiding surface degradation of TFT oxide and body layers. The present invention also provides a cell having a TFT structure which has a low Ioff. The inventive process eliminates the HF precleaning of a TFT gate oxide layer, thus avoiding surface degradation and maintaining the smoothness of the gate oxide layer.

In accordance with the present invention, the TFT gate oxide is deposited over the TFT gate poly layer. The TFT gate poly layer includes a gate and a drain connection to the drain of the driver. No hole in patterned over the TFT gate oxide before the deposition of a TFT body layer. Therefore, no HF precleaning step is needed or performed. The TFT body layer is then deposited over the gate layer. Source and drain regions are formed in the TFT body layer.

In order to connect to drain region of the TFT body layer with the drain connection in the TFT gate layer, a via is formed through the TFT drain and TFT oxide layer. Polysilicon is formed on the walls of the via to provide a conductive path from the TFT drain to the TFT drain connection of the TFT gate layer. A detailed description of the method used to form the via is provided below.

BRIEF DESCRIPTION OF THE DRAWING

FIGS. 3a–3d illustrate a conventional process for forming a portion (leg 70) of the TFT SRAM cell.

DETAILED DESCRIPTION OF THE INVENTION

The present invention is directed to a structure and a method for making a TFT, used for example in an SRAM cell, wherein the TFT gate oxide layer in not patterned before deposition of the TFT body layer. This eliminates the HF precleaning of the TFT gate oxide layer thus eliminating TFT gate oxide surface degradation. After forming the TFT gate oxide layer, instead of patterning and precleaning the TFT gate oxide layer, a TFT body layer is formed over the TFT gate oxide layer. Next, a via with polysilicon walls is formed through the TFT gate oxide and body layers. The via provides a good connection between the TFT body layer and an underlying TFT drain connection in the TFT gate layer.

Figure 3C:
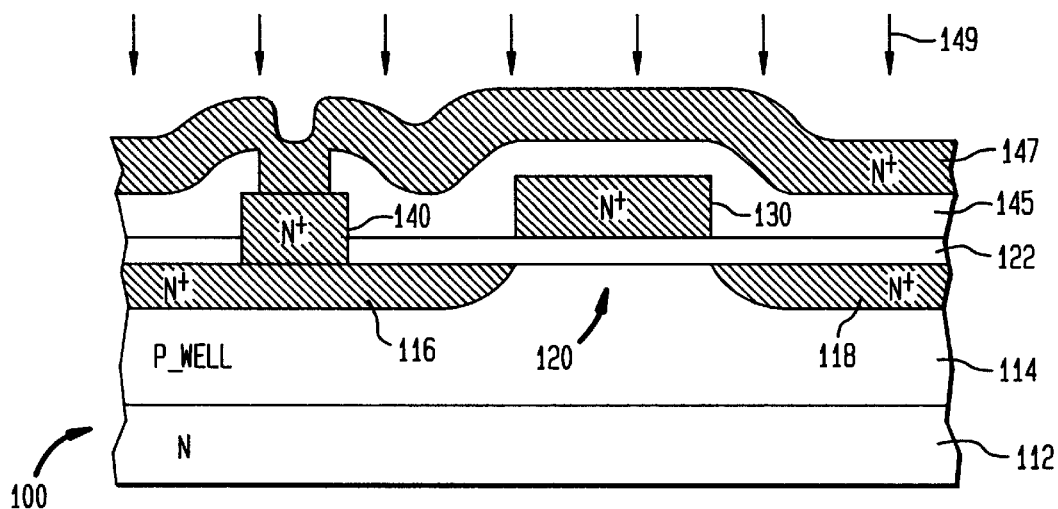
Figure 3D:
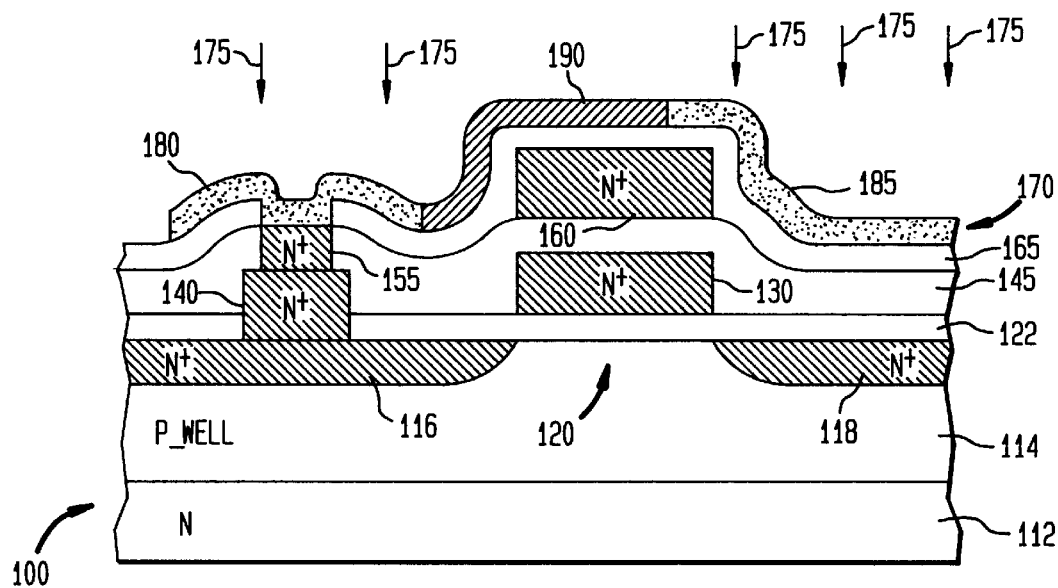
Figure 4:
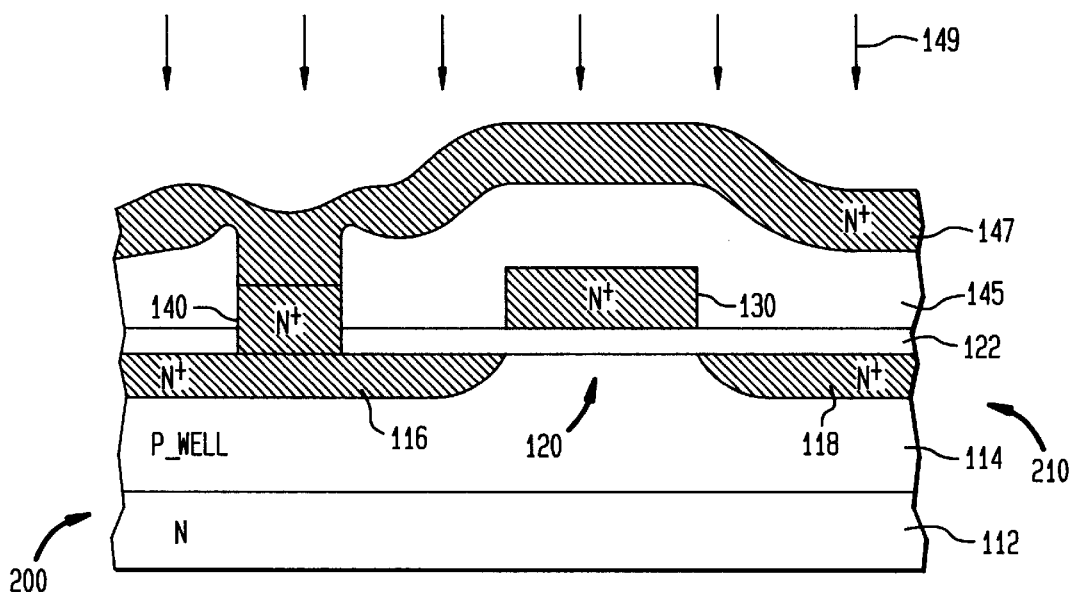
FIGS. 4–10 illustrate a process for forming a portion (leg 70) of the TFT SRAM cell according to the invention.

The starting point for the inventive method according to an illustrative embodiment is shown in FIG. 4. FIG. 4 shows a silicon wafer 200 having an underlayer structure 210 covered by a thick inter-poly-dielectric (IPD) 145. The IPD layer 145 and the particular structure of the underlayer structure 210 are similar to the IPD layer 145 and the structure of the NMOS driver underlying the IPD layer 145 of the prior art TFT SRAM structure 100 shown in FIGS. 3b–3d. That is, the underlayer structure 210 is formed as described above in connection with FIGS. 3a–3b. The underlayer structure 210 has a silicon substrate 112 with a P-well 114 formed thereon. Illustratively the silicon substrate 112 is N-type with a dopant concentration of about $10^{15}$ cm$^{-3}$. Ions, such as N-type ions, are implanted in the P-well 114 to form the $N^+$ drain 116 and source 118 separated by the channel 120. The oxide layer 122 is formed over the silicon wafer 200. A portion of the oxide layer 122 is etched to expose a portion of the drain 116. A first layer of polysilicon (poly-1 126 of FIG. 3a) is deposited over the oxide layer 122 and over the exposed portion of the drain 116.

The poly-1 layer is patterned and doped by implanting N-type ions to form the $N^+$ gate 130 over the channel 120 and an $N^+$ drain connection 140 over the exposed portion of the drain 116. Next, the IPD layer 145 is formed over the gate 130, the oxide layer 122 and the sides of the $N^+$ drain connection 140. Illustratively, the inter-poly-dielectric (IPD) 145 has a thickness of approximately 200 Å. The IPD layer 145 is patterned to expose a portion of the $N^+$ drain connection 140.

A layer of polysilicon (poly-2) 147 is deposited over the IPD layer 145. The poly-2 layer 147 is the gate layer of the TFT which is to be formed on the IPD layer 145. Illustratively, the poly-2 TFT gate layer 147 has a thickness of approximately 1000 Å. Next, N-type ions 149 are implanted in the poly-2 TFT gate layer 147 to form a heavily doped $N^+$ poly-2 TFT gate layer 147 having a dopant concentration of about $10^{20}$ cm$^{-3}$. Illustratively, the ions 149 are As ions and are implanted using a flux density of approximately $10^{15}$ cm$^{-2}$ and an energy of approximately 80 Kev.

Figure 5:
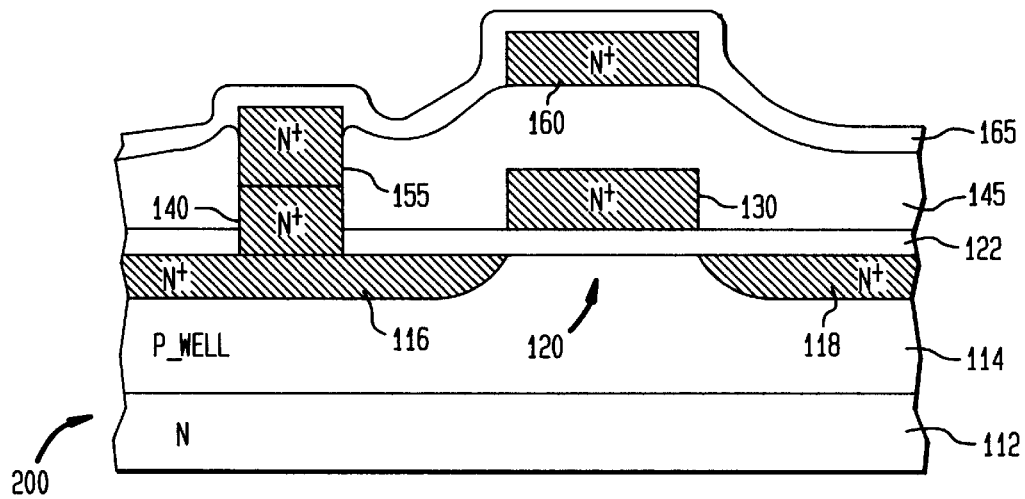

As shown in FIG. 5, the heavily doped $N^+$ poly-2 TFT gate layer 147 is patterned to form an $N^+$ poly-2 TFT drain connection 155 and an $N^+$ TFT gate 160. Illustratively, patterning of the $N^+$ poly-2 layer 147 is performed by forming a mask (not shown) on the $N^+$ poly-2 TFT gate layer 147 and subsequent etching. Illustratively, the etching may be wet or dry etching using $C_2F_6$.

Next, a thin TFT gate oxide layer 165 is deposited over the wafer 200 using CVD (Chemical Vapor Deposition). As shown, the TFT gate oxide layer 165, by virtue of being formed by the CVD process, conforms to the contour of the surface of the wafer 200. The surface of the TFT gate oxide layer 165 is smooth. Illustratively, the TFT gate oxide layer 165 has a thickness of 300 Å. Unlike the prior art, the TFT gate oxide layer 165 is not etched at this time. Therefore, the TFT gate oxide layer 165 does not require any HF precleaning prior to formation of the TFT body layer. Avoiding any HF precleaning allows the surface of the oxide layer 165 to retain its smoothness. This allows the formation of a smooth poly-3 layer 170, shown in FIG. 6, which acts as a high quality TFT body layer.

Figure 6:
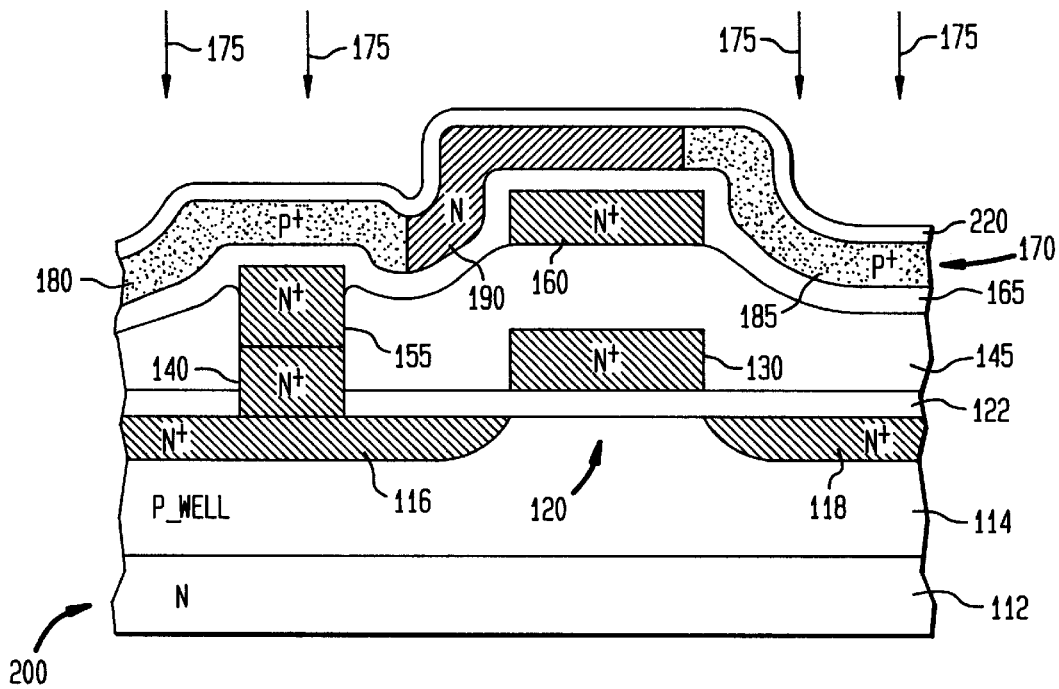

As shown in FIG. 6, the poly-3 TFT body layer 170 having a smooth surface is deposited over the smooth surfaced TFT gate oxide layer 165. Illustratively, the poly-3 TFT body layer 170 has a thickness of 600 Å. N-type ions (not shown) are implanted in the poly-3 TFT body layer 170 to form an N-type poly-3 layer 170.

A thin layer of TFT screen oxide 220, having a thickness of 100 Å, is grown thermally over the smooth N-type poly-3 layer 170. Next, selective doping of the poly-3 layer 170 is performed, for example, by masking areas of the N-type poly-3 layer 170 which are not to be implanted, and using high dose ion implantation. This selective implantation forms a $P^+$ TFT drain 180 and $P^+$ TFT source 185 in the poly-3 TFT body layer 170 not covered by the mask (not shown). The portion of the poly-3 TFT body layer 170 covered by the mask acts as the TFT channel 190. Thus, the $P^+$ TFT drain 180 is separated from the $P^+$ TFT source 185 by the N-type TFT channel 190. The selective implantation is shown by arrows 175 in FIG. 6. Illustratively, the implanted ions 175 are $BF_2$ and are implanted using a flux density of about $10^{15}$ cm$^{-2}$ and an energy of about 50 Kev.

The $P^+$ TFT drain 180 in the N-type poly-3 layer 170 fully covers the poly-2 TFT drain connection 155 and extends beyond both sides of the poly-2 TFT drain connection 155. The $P^+$ TFT source 185 of the N-type poly-3 TFT body layer 170 partially covers the $N^+$ TFT gate 160 and extends beyond one side of the TFT gate 160, which side is farthest from the $N^+$ poly-2 TFT drain connection 155.

Figure 7:
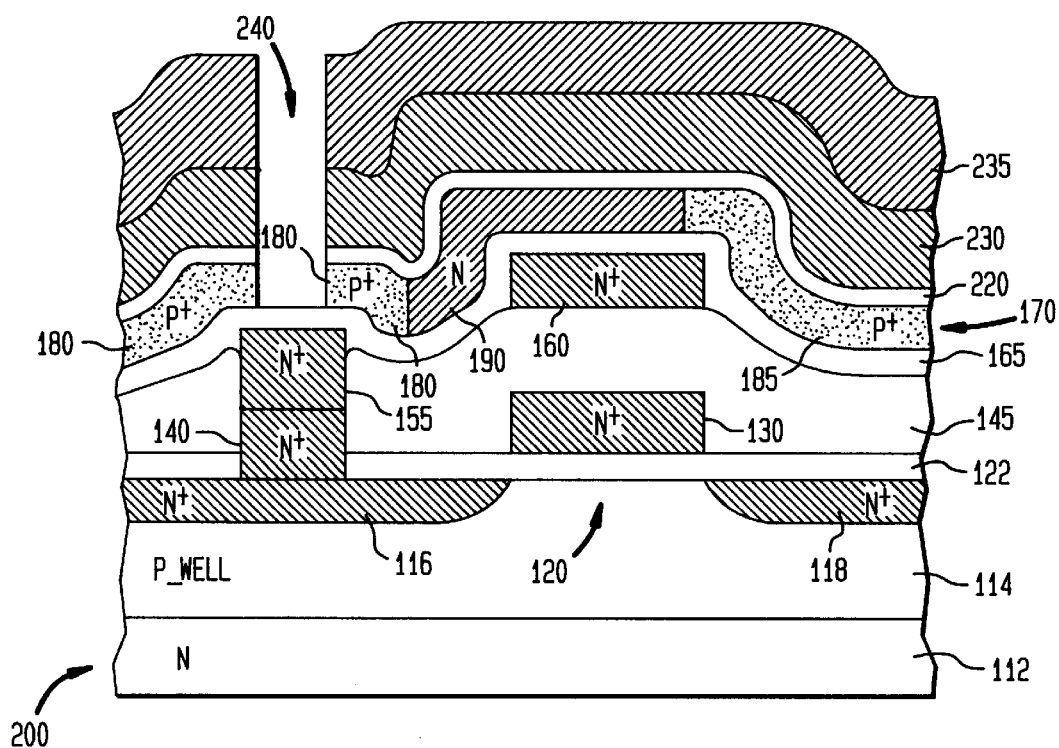

As shown in FIG. 7, the wafer 200 is covered with a nitride layer 230 using, for example, a CVD process. Illustratively, the nitride layer 230 has a thickness of 1500 Å. The nitride layer 230 may be planarized. Next, a photolithographic process is performed wherein a photo-resist mask 235 is formed covering the wafer 200 except for an area over the $N^+$ poly-2 TFT drain connection 155. The unmasked area of the wafer 200 is etched. This forms a via hole 240 through the nitride layer 230, the screen oxide 220, and the $P^+$ TFT drain 180. At this point the via 240 is terminated at the gate oxide layer 165. Illustratively, the via 240 has a cylindrical shape with a circular cross-section.

Figure 8:
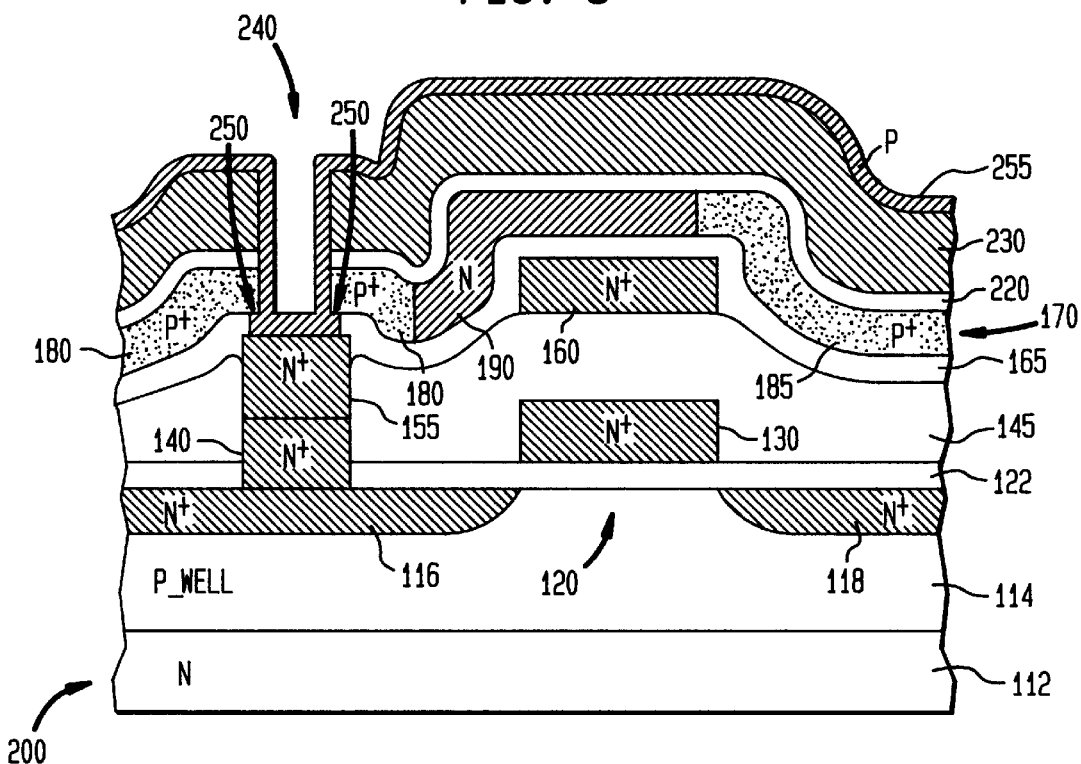

As shown in FIG. 8, the photo-resist mask 235 is removed followed by removal of the portion of the gate oxide layer 165 exposed through the via 240. Illustratively, this exposed portion of the gate oxide layer 165 is etched away by HF isotropic wet etching. The HF isotropic wet etching not only removes the portion of the gate oxide layer 165 exposed through the via 240, but also removes a portion of the gate oxide layer 165 below the $P^+$ TFT drain 180. This forms a recess 250 extending approximately 1000 Å laterally away from the sides of the via 240.

Next, a poly-4 layer 255, having a thickness of approximately 500 Å, is deposited to cover the wafer 200. The poly-4 layer 255, which may be P-type, lines the side walls of the via 240 and fills the recess 250 above the $N^+$ poly-2 TFT drain connection 155.

Figure 9:
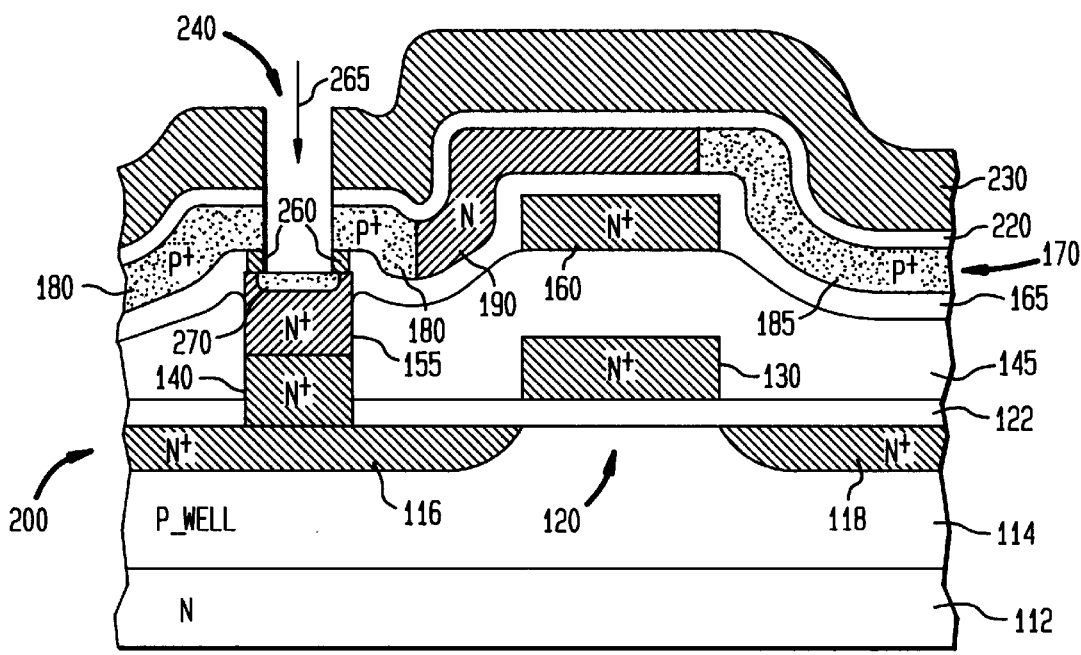

As shown in FIG. 9, a poly etch-back is performed to remove the poly-4 layer 255 over the wafer 200 except for the poly-4 within the recess 250 of the via 240. The P-type poly-4 255 remaining within the recess 250 has the shape of an annular ring 260 which surrounds the via 240. The poly-4 ring 260 acts as a side wall connector between the TFT drain 180 in the poly-3 TFT body layer 170 and the $N^+$ poly-2 TFT drain connection 155 formed from the $N^+$ poly-2 TFT gate layer 147 (FIG. 4).

Next, $P^+$ ions 265 are implanted through the via 240 to convert the top 270 of the $N^+$ poly-2 TFT drain connection 155 in the via 240 from N-type to P-type. Illustratively, the $P^+$ ions 265 are implanted using a high dose $BF_2$ implant having a flux density of about $10^{15}$ cm$^{-2}$ and an energy of about 50 Kev.

Figure 1:
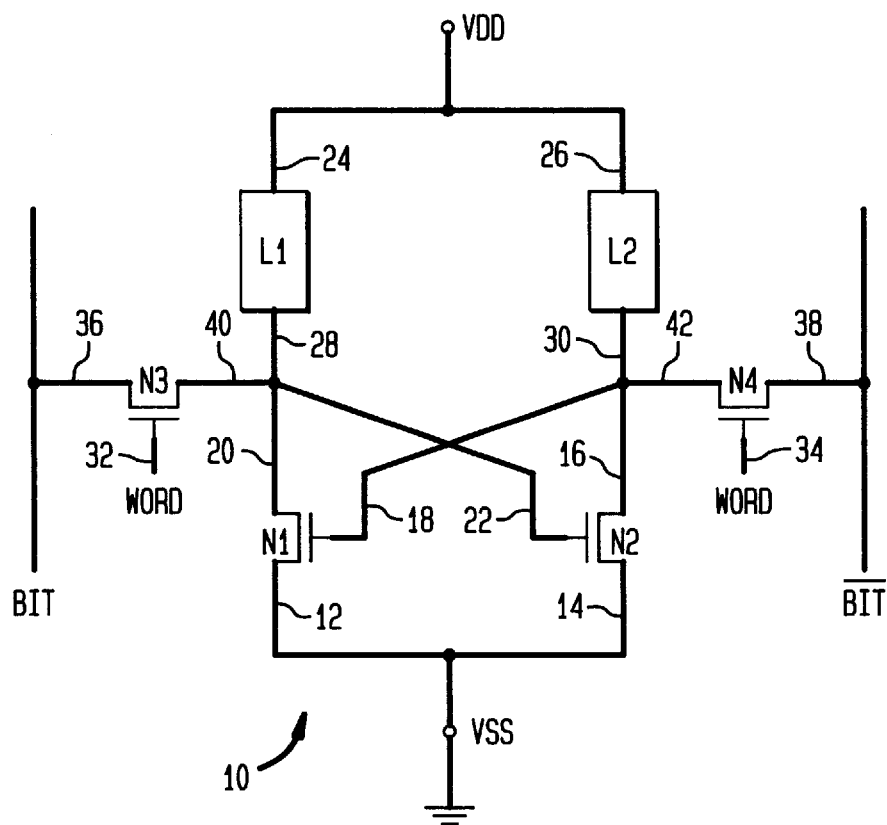
FIG. 1 is a circuit diagram of a conventional SRAM cell.
Figure 2:
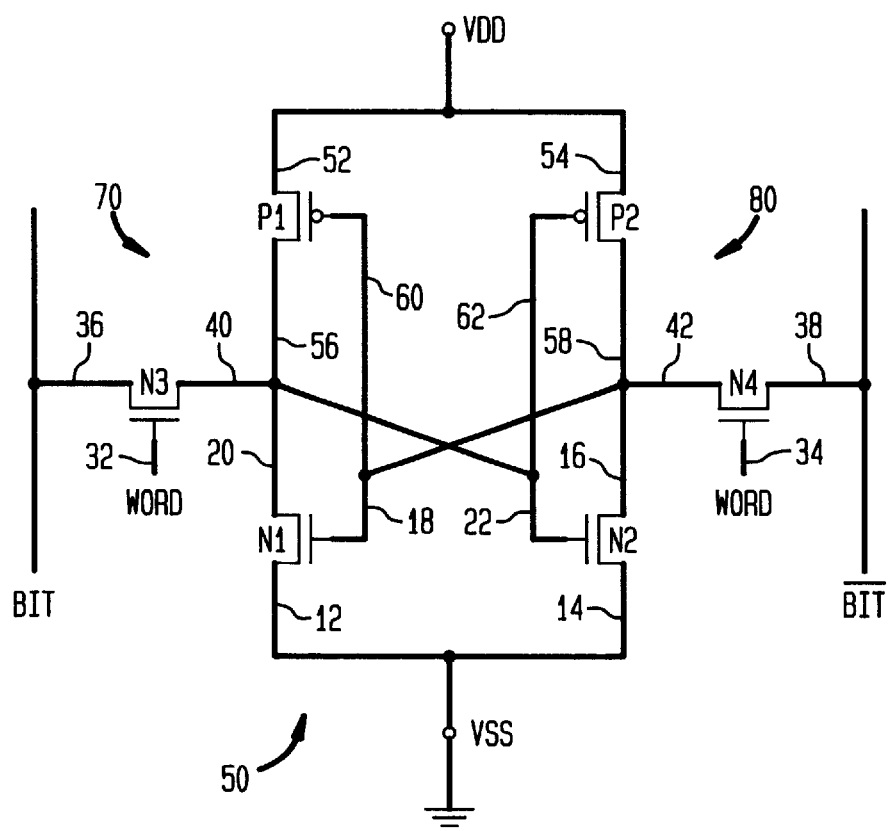
FIG. 2 is a circuit diagram of a conventional TFT-SRAM cell.
Figure 10:
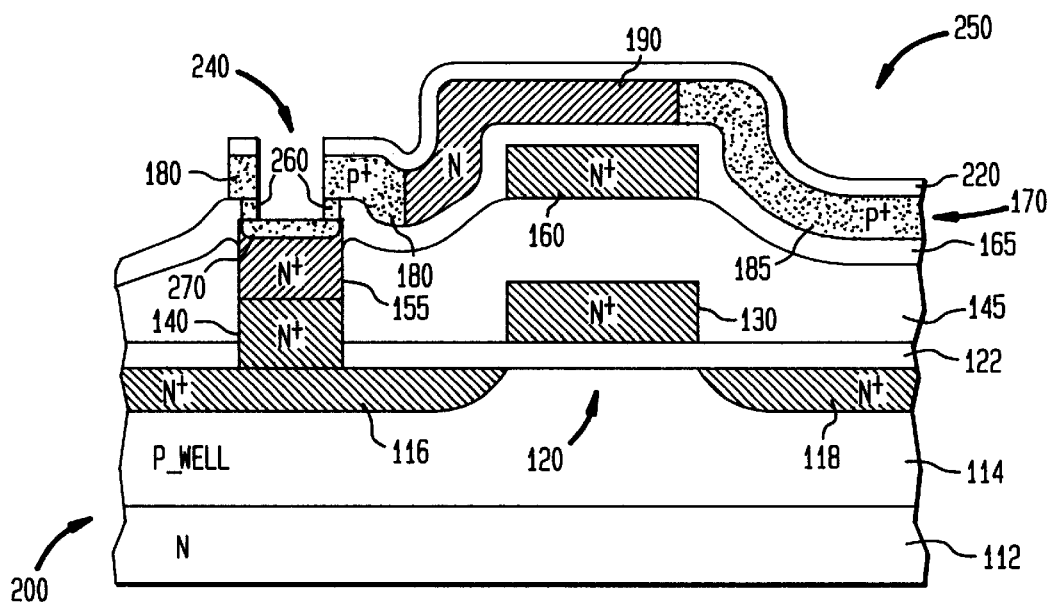

FIG. 10 shows a low off current TFT 250 formed by the inventive process over the wafer 200 which contains a pulldown NMOS N1, as described in connection with FIGS. 2–3d. As shown in FIG. 10, the nitride layer 230 is removed with hot phosphorous acid. This exposes the screen oxide 220. The exposed screen oxide 220 and poly-3 TFT layer 170 are patterned and etched to form a desired pattern using a conventional photolithographic process.

Heat treatment in subsequent back-end processes dopes the poly-4 ring connector 260 with P-type dopants. The P-type dopants are thermally outdiffused from the P-type top portion 270 of the poly-2 TFT drain connection 155 located below the poly-4 ring connector 260. Due to the heat treatment, additional P-type dopants are also thermally outdiffused from the $P^+$ drain 180 located above the poly-4 ring connector 260. Thermal outdiffusion of the P-type dopants from the P-type top portion 270 of the $N^+$ poly-2 TFT drain connection 155 to the rest of the $N^+$ poly-2 connection 155 also enlarges the portion 270.

The back-end processes include thermal annealing and deposition of a PMD (Pre-Metal-Dielectric) layer. The PMD layer is then patterned to form openings for metal contacts. After forming the metal contacts in the openings, metallization is formed over the PMD layer and the metal contacts. A passivation layer is formed to finish the whole process.

The TFT 250 formed by the inventive process has a low off current where approximately Ioff<1 pA. Therefore, the TFT 250 has a large Ion/Ioff ratio. This is accomplished by avoiding the need to use HF precleaning which degrades the smoothness of the gate oxide surface prior to deposition of the poly-3 layer. The inventive process can be applied to fabricate any TFT having low off, low stand-by power, and high Ion/Ioff ratio, such as a TFT SRAM cell.

Finally, the above described embodiments of the present invention are intended to be illustrative only. For example, the invention has been described using the TFT 250 which is a PMOS device. However, the present invention is equally applicable to NMOS TFTs. Numerous alternative methods, structures and embodiments may be devised by those skilled in the art without departing from the spirit and scope of the following claims.

I claim:

1. A method for forming a thin film transistor (TFT) comprising the steps of:

forming on a substrate a polysilicon drain connection and a polysilicon gate;

depositing a gate oxide layer on said drain connection and gate;

immediately after depositing said oxide layer, forming a polysilicon TFT body layer on said oxide layer, said TFT body layer including source and drain regions;

forming a via through a portion of said drain of said TFT body layer and said oxide layer, said via terminating at said drain connection;

forming a recess in a side wall of said via by removing a portion of said oxide layer below said TFT body layer; and forming a polysilicon side wall on a portion of said via extending through said oxide layer to provide a conductive path between said drain connection and said drain of said TFT body layer.

2. The method of claim 1, wherein the step of forming the polysilicon side walls fills said recess.

3. The method of claim 2, after the step of forming the polysilicon side walls, further comprising removing said polysilicon side walls from said via while retaining said polysilicon side walls in said recess.

4. The method of claim 2, after the step of forming the polysilicon side walls, further comprising the steps of:

implanting ions in said drain connection; and thermally outdiffusing said implanted ions into said polysilicon side walls located in said recess.

5. The method of claim 1, further comprising the steps of:

forming said source and drain regions;

thermally growing a screen oxide layer over said polysilicon TFT body layer; and then implanting ions selectively in said TFT body layer to selectively dope said source and drain regions.

6. The method of claim 5, after the step of selective doping, further comprising forming a nitride layer over said screen oxide layer.

7. The method of claim 6, wherein the step of forming the nitride layer is performed using chemical vapor deposition.

8. The method of claim 6, wherein the step of forming the via comprises the steps of:

selectively etching through the nitride layer, the screen oxide layer, and the polysilicon TFT body layer to expose a portion of said oxide layer; and isotropically wet etching said oxide layer exposed through said via to form a recess in said side walls of said via by removing a portion of said oxide layer below said TFT body layer.

9. The method of claim 6, after the step of forming the polysilicon side walls, further comprising the steps of:

implanting ions in said drain connection;

removing the nitride layer with hot phosphorous acid to expose the screen oxide;

patterning the exposed screen oxide and polysilicon TFT body layer; and thermally outdiffusing said implanted ions into said polysilicon side walls.

10. The method of claim 1, wherein the step of forming the polysilicon drain connection and the polysilicon gate comprises the steps of:

forming an inter-poly-dielectric layer on said substrate;

forming a polysilicon gate layer on said inter-poly-dielectric layer;

implanting ions in said polysilicon gate layer;

selectively etching said implanted polysilicon gate layer to form said polysilicon drain connection and polysilicon gate.

11. A method for forming a thin film transistor comprising the steps of:

depositing an oxide layer on a substrate having a drain connection and a gate;

immediately after depositing said oxide layer, forming a polysilicon layer on said oxide layer, said polysilicon layer having a source and a drain;

forming a via through said polysilicon and oxide layers, said via terminating at said drain connection; and forming a connector around said via surrounded by said oxide layer between said drain connection and said polysilicon layer.

12. The method of claim 11, after the step of forming the connector, further comprising the step of:

implanting ions in the drain connection; and thermal annealing to outdiffuse into the connector ions from the drain and the implanted ions from the drain connection.

13. The method of claim 11, wherein the step of forming the via comprises forming a recess in side walls of said via by removing a portion of said oxide layer below said polysilicon layer.

14. The method of claim 13, wherein the step of forming the connector forms said connector in said recess.

15. The method of claim 11, wherein the step of forming the via comprises the steps of:

selectively etching through said polysilicon layer; and isotropically wet etching said oxide layer through said via to form a recess extending from said via into said oxide layer by removing portions of said oxide layer below said polysilicon layer.

* * * * *